(12) United States Patent
Tabara et al.

(10) Patent No.: US 6,509,261 B2
(45) Date of Patent: Jan. 21, 2003

(54) WIRING FORMING METHOD

(75) Inventors: Suguru Tabara, Hamamatsu (JP); Hiroshi Nakaya, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/969,270

(22) Filed: Oct. 1, 2001

(65) Prior Publication Data

US 2002/0052107 A1 May 2, 2002

Related U.S. Application Data (62) Division of application No. 09/109,443, filed on Jul. 2, 1998, now Pat. No. 6,348,404.

(30) Foreign Application Priority Data

Jul. 2, 1997 (JP) .............................. 9-191985

(51) Int. Cl.⁷ .......................................... H01L 21/4763
(52) U.S. Cl. ...................... 438/636; 438/625; 438/652; 438/656; 438/669; 438/952
(58) Field of Search ................................ 438/636, 625, 438/652, 656, 669, 952

(56) References Cited

U.S. PATENT DOCUMENTS

| 5,707,883 A | 1/1998 | Tabara |
| 5,914,277 A | 6/1999 | Shinohara .................... 438/720 |
| 5,980,768 A | 11/1999 | Abraham ..................... 216/67 |

FOREIGN PATENT DOCUMENTS

| EP | 0813114 | 12/1997 |
| JP | 61231182 | 10/1986 |
| JP | 6262523 | 3/1987 |
| JP | 6263427 | 3/1987 |
| JP | 7312336 | 11/1995 |

*Primary Examiner*—David L. Talbott
*Assistant Examiner*—David A. Zarneke
(74) *Attorney, Agent, or Firm*—Dickstein, Shapiro, Morin & Oshinsky, LLP

(57) ABSTRACT

After a wiring material layer (14) which is made of $WSi_2$ or the like is formed on an insulation film covering a semiconductor substrate (10), a first antireflection coating film (18) which is made of TiON or TiN and a second antireflection coating film (18) which is made of an organic material are sequentially formed on the wiring material layer (14). Resist patterns (20a to 20c) are formed on the second antireflection coating film (18) by photolithography. The dry etching of the second antireflection coating film (18) is performed using the resist patterns (20a to 20c) as masks, after which the dry etching of the first antireflection coating film (16) is conducted using the resist patterns (20a to 20c) and patterns (18a to 18c) of the second antireflection coating film (18) as masks. The dry etching of the wiring material layer (14) is effected using the resist patterns (20a to 20c), the patterns (18a to 18c) of the second antireflection coating film (18) and patterns (16a to 16c) of the first antireflection coating film (16) as masks. The resist patterns (20a to 20c) and the patterns (18a to 18c) of the second antireflection coating film (18) are removed. Lamination layers, each including one of patterns of the wiring material layer (14) and one of the patterns of the first antireflection coating film (16), form wiring layers. The resist patterns (20a to 20c) and the patterns of the second antireflection coating film (18) may be removed after the etching of the first antireflection coating film (16), and the wring material layer (14) may be etched using the patterns of the first antireflection coating film (16) as masks.

4 Claims, 6 Drawing Sheets

WIRING FORMING METHOD

This application is based on Japanese Patent Application No. HEI 9-191985 (filed on Jul. 2, 1997, for the invention made by Tabara and Nakaya), and a divisional of U.S. patent application Ser. No. 09/109,443, filed Jul. 2, 1998 now U.S. Pat. No. 6,348,404, all the contents of which are incorporated herein by reference.

BACKGROUND OF THE INVENTION a) Field of the Invention

The present invention relates to a wiring forming method which is suitable to form a fine wiring in an LSI or the like, and more particularly to a wiring forming method aimed at improving the precision of the size of wiring patterns by forming antireflection coating on a wiring film and under a resist layer.

b) Description of the Related Art

A process for forming a wiring is indispensable for the manufacturing of a semiconductor integrated circuit. The wiring becomes complicated along with an improvement in the integration density, and the formation of a fine wiring and a multilayered wiring is required. After isolation regions and a large number of elements are formed in a semiconductor substrate, wiring for connecting those elements to each other is patterned. Wiring patterns are formed by depositing a wiring layer, forming resist patterns on the wiring layer and etching the wiring layer through utilization of the resist patterns as masks. If the base on which the wiring layer is formed is uneven, however, the surface of the wiring layer may also become uneven and have convex and concave parts (projections and recesses). Generally speaking, the wiring layer has a high reflectance with respect to light, especially with respect to short-wavelength light. When coating a resist layer on the uneven surface of the wiring layer and exposing the resist layer to light, the reflection of the light from the wiring layer is a problem.

A concave part of the surface of the wiring layer may form a concave mirror and the light reflected from the concave mirror may be converged at a region which is not to be exposed to light (this is known as "halation"). The halation causes the thinning and thickening of the wiring patterns, the breaking of the wiring and the formation of isolated spots.

A convex part of the surface of the wiring layer may form a convex mirror and the light reflected from the convex mirror may illuminate even a region which is not exposed to light. This degrades the accuracy of the light exposure.

The above-described phenomena can be reduced by reducing the light reflection from the underlying surface at the time of subjecting the resist layer to the light exposure.

It is generally known that in the case of forming a resist layer with the required patterns on a wiring material layer having a high reflectance by photolithography, antireflection coating is provided under the resist layer (and on the wiring material layer) so that the light reflection from the wiring material layer is suppressed to improve the pattern transfer accuracy. An inorganic single layer which is made of TiON, TiN, SiON, SiN or the like is often employed as an antireflection coating film of this type. Sometimes an organic single layer which can be formed by a simple coating process is adopted (as seen from Published Unexamined Japanese Patent Applications Kokai Nos. 61-231182, 62-62523 and 62-63427, for example).

In the case of employing a TiON (or TiN) single layer film as the antireflection coating film, the effect of preventing the reflection of a KrF excimer laser beam (having a wavelength of 248 nm) used in the far ultraviolet ray exposure is not satisfactory.

Figure 13:
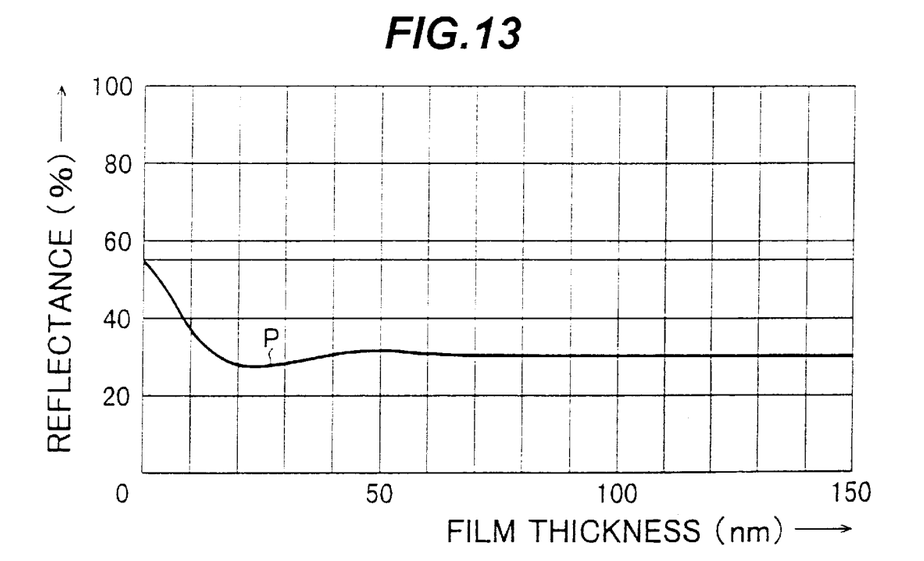
FIG. 13 is a graph showing the dependence of the reflectance on the film thickness, which dependence has been obtained by performing a computer simulation as regards the TiON film P.

FIG. 13 shows the dependence of the reflectance on the film thickness. This dependence was obtained by performing a computer simulation as regards a TION film P provided on a $WSi_2$ (tungsten silicide) layer.

Reflectivity of a multi-layer structure was obtained by computer simulation under the following conditions.

Figure 14:
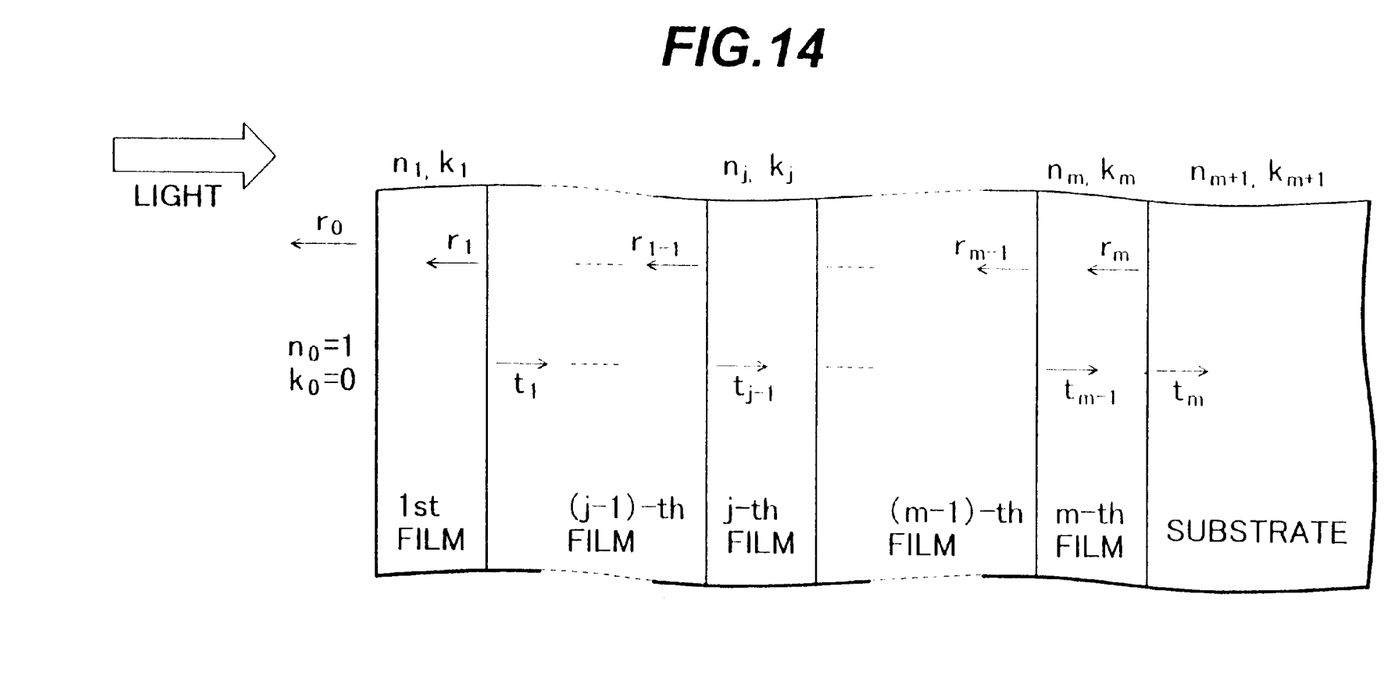
FIG. 14 is a diagram illustrating a model of a multi-layer structure used in computer simulation.

On a substrate, m layers are stacked. The uppermost layer exposed to air ($n_o=1$, $k_o=0$) is called the first layer. The underlying layers are called the second, third, . . . , and m-th layers. The substrate is called the (m+1)-th layer. The real part and the imaginary part of the complex refractive index $n_i$ of the i-th layer are denoted $n_i$ and $k_i$. Therefore, $\tilde{n}_i = n_i - ik_i$. The complex reflectivity is denoted by r, and the complex transmissivity is denoted by t. Complex reflectivities at the uppermost surface, the first, second, third, . . . , interfaces are denoted by $r_0, r_1, r_2, r_3, \ldots$ . The complex reflectivity on the substrate surface is $r_m$. Complex transmissivity at the first, second, third, . . . interfaces are denoted by $t_1, t_2, t_3, \ldots$ . The complex transmissivity at the substrate surfaces is $t_m$. These notations are shown in FIG. 14.

The intensity reflection on the substrate surface $R_m$ is $$R_m = |r_m|^2 = |(1-\tilde{n}_{m+1})/(1+\tilde{n}_{m+1})|^2$$

The complex reflectivity of the j-th layer $r_{j-1}$ is $$r_{j-1} = [\{exp(-2i\phi_j)\}(F_j - r_j) - F_j(1 - F_j r_j)]/[F_j\{exp(-2i\phi_j)\}(F_j - r_j) - (1 - F_j r_j)],$$

where
$F_j = (n_o - \tilde{n}_j)/(n_o + \tilde{n}_j)$,
$n_o = 1$,
$\lambda$: wavelength, and
d: thickness of the layer.

The simulation adopted obtains $r_{m-1}$ by substituting $r_m$, then $r_{m-2}$ by substituting $r_{m-1}$, . . . and $r_o$ by substituting $r_1$.

The intensity reflection becomes $$R_i = |r_i|^2.$$

The simulation conditions in that case were as follows:
Wavelength of light: 248 nm
Refractive index "n" and
extinction coefficient "k" of TiON film:
n=2.28
k=1.5
Refractive index "n" and
extinction coefficient "k" of $WSi_2$ layer:
n=2.5
k=3.15
Reflectance at TiON/$WSi_2$ interface: 54.9%

It can be understood from FIG. 13 that even though the film thickness was set at the optimum value, the reflectance could only be reduced to approximately 30% and thus the effect of preventing the light reflection was not satisfactory.

In the case of employing an SiON (or SiN) single layer film as the antireflection coating film, a CVD (Chemical Vapor Deposition) apparatus is required for the film formation, which lacks simplicity. If a film having an ideal refractive index and extinction coefficient is intended, the realization of both the uniformity of the film thickness and throughput is difficult.

In the case of using an organic single layer film as the antireflection coating film, the precision of the size of the wiring patterns is low.

The organic antireflection coating film is made of an organic material of the same kind as a resist. An etching gas which contains oxygen as the main component is frequently used in the dry etching of the organic film. When the organic antireflection coating film is subjected to the anisotropic dry etching process using the resist patterns as masks after the formation of the resist layer, not only the antireflection coating film but also the resist layer is etched. In a film thickness range B shown in FIG. 12, the antireflection coating film is thick, and accordingly the time required for the etching is long. Due to this, the amount of shift in the size of the resist layer (the amount of thinning) is large, resulting in the degraded precision of the size of the wiring patterns.

Figure 12:
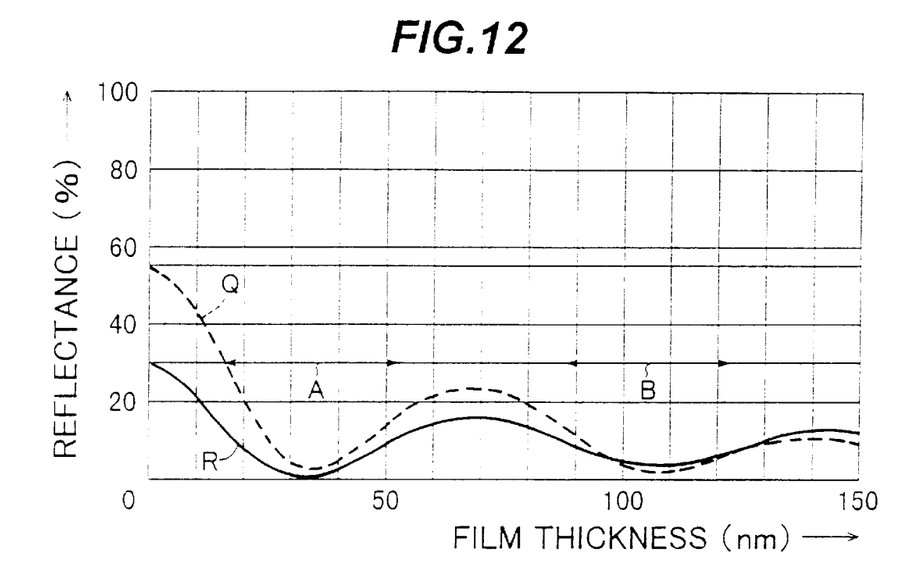
FIG. 12 is a graph showing the dependence of the reflectance on the film thickness, which dependence has been obtained by performing a computer simulation as regards the organic antireflection coating film Q and the lamination film R which includes a TiON film and an organic antireflection coating film stacked on the TiON film.

FIG. 12 shows the dependence of the reflectance on the film thickness. This dependence was obtained by performing a computer simulation as regards an organic antireflection coating film Q provided on an $WSi_2$ layer. The organic antireflection coating film Q may be formed of acrylic acid resin having side chains which contain organic group effectively absorbing KrF excimer laser light of a main wavelength of 248 nm, for example:

where R is a portion absorbing light of a wavelength 248 nm, such as $x = 10$ mol % to 80 mol %, and
$y = 20$ mol % to 90 mol %.

Computer simulation was done using the formulae as described above. The simulation conditions in that case were as follows:
Wavelength of light: 248 nm
Refractive index "n" and
extinction coefficient "k" of film Q:
  n=1.654
  k=0.23
Refractive index "n" and
extinction coefficient "k" of $WSi_2$ layer:
  n=2.5
  k=3.15
Reflectance at film Q/$WSi_2$ interface: 54.9%

It can be understood from FIG. 12 that in a film thickness range A, for example, reflectance variations versus film thickness variations are considerable. Normally the surface on which a wiring is to be formed is uneven and has convex and concave parts, and an organic antireflection coating film is formed on such a surface by a spin coating method or the like. A portion of the antireflection coating film which is located on the top of a convex part and another portion of the antireflection coating film which is located on the bottom of a concave part differ considerably in thickness from each other. In such a case, when the organic antireflection coating film is formed within a film thickness range like the range A, the reflectance variations are so large that the accuracy of the transfer of fine patterns is degraded. In consideration of this, the organic antireflection coating film is formed within a film thickness range such as the range B in which the reflectance variations are small. In the film thickness range B, however, the antireflection coating film has a large thickness of approximately 100 nm.

When the organic antireflection coating film is formed on the uneven surface by the spin coating method or the like, a portion of the antireflection coating film which is located on the top of a convex part of the surface and another portion of the antireflection coating film which is located on the bottom of a concave part of the surface differ considerably from each other. In order to completely remove the antireflection coating film from the top of the convex or higher level part and the bottom of the concave or lower level part by subjecting the antireflection coating film to the anisotropic dry etching process which uses the resist layer as a mask, over-etching has to be performed even after the wiring material layer appears at the top of the convex or upper level part where the antireflection coating film is relatively thin and until the wiring material layer appears also at the bottom of the concave or lower level part where the antireflection coating film is relatively thick. Due to this, the amount of shift in the size of the resist layer is increased, degrading the precision of the size of the wiring patterns.

SUMMARY OF THE INVENTION

It is accordingly an object of the present invention to provide a wiring forming method which can improve the precision of the size of the wiring patterns.

According to one aspect of the present invention, there is provided a wiring forming method comprising the steps of:forming a wiring material layer on an insulation film covering one of major surfaces of a substrate; forming a first antireflection coating film made of one of TiON and TiN on the wiring material layer; stacking a second antireflection coating film made of an organic material directly on the first antireflection coating film; coating a resist layer on a lamination film which includes the first and second antireflection coating films, and exposing the resist layer to light in accordance with predetermined wiring patterns; forming resist patterns by developing the resist layer which has been exposed to light; and selectively removing the second antireflection coating film by anisotropic dry etching process which uses the resist patterns as masks, in order to leave patterns of the second antireflection coating film which correspond to the resist patterns.

Since the first antireflection coating film which is made of TiON or TiN is provided under the second antireflection coating film which is made of an organic material, the thickness of the second antireflection film can be reduced. A reduction in the thickness of the second antireflection film results in a reduction in the time required for performing the dry etching of the second antireflection coating films through utilization of the resist patterns as masks. Accordingly, the amount of shift in the size of the resist patterns is reduced such that the precision of the size of the wiring patterns is improved.

The first antireflection coating film and the wiring material layer formed thereunder can be selectively etched using the resist patterns and the patterns of the second antireflection coating film as masks.

In order to form patterns of the first antireflection coating film, the first antireflection coating film may be selectively removed by the anisotropic dry etching process which uses the resist patterns and the patterns of the second antireflection coating films as masks, and then the resist patterns and the patterns of the second antireflection coating film may be removed. The patterns of the first antireflection coating film can be used as masks in a later etching process.

Such a thin resist layer as can serve only as a mask at the time of etching the first and second antireflection coating films will suffice. The use of the thin resist layer ensures an improved definition in transferring the wiring patterns to the resist layer and permits the depth of focus to be greater than the thickness of the resist layer so that fine wiring patterns can be transferred with high accuracy to the resist layer.

Thus, a lamination film including a TiON (or TiN) film and an organic antireflection coating film stacked thereon is used as the antireflection coating provided under the resist layer. This permits the organic antireflection coating film to be formed thin so that the amount of shift in the size of the resist layer at the time of etching the organic antireflection coating film is reduced to improve the wiring patterning accuracy.

After the removal of the resist layer and the patterns of the organic antireflection coating film, the patterns of the TiON (or TiN) film can be used as masks in etching the wiring material layer. This allows the resist layer to be formed thin so that the accuracy of the transfer of fine wiring patterns to the resist layer is improved to increase the yield of the wiring formation.

DETAILED DESCRIPTION OF THE PREFERRED EMBODIMENTS

FIGS. 1 to 8 illustrate the wiring forming method according to the first embodiment of the present invention. The steps (1) to (8), illustrated in FIGS. 1 to 8, respectively, will now be explained in sequence.

Figure 1:
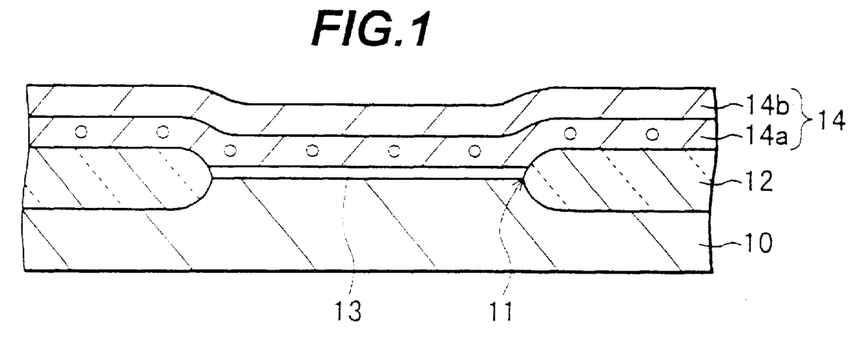
FIG. 1 is a sectional view of a substrate which shows the step of forming the wiring material layer according to the wiring forming method of the first embodiment of the present invention.

(1) A silicon oxide insulation film 12 with an aperture 11 is formed by the LOCOS (Local Oxidation of Silicon) on a surface of a semiconductor substrate 10 which is made of silicon or the like. A gate oxide film 13 is formed by thermal oxidation in the aperture 11 for a transistor to be isolated from other elements by the insulation film 12. A wiring material layer 14 for forming a gate electrode and a gate wiring is formed on the substrate surface. A lamination layer (a $WSi_2$/polysilicon type polycide layer) which includes, for example, a polysilicon layer 14a and a $WSi_2$ layer 14b stacked thereon, can be formed as the wiring material layer 14.

Figure 2:
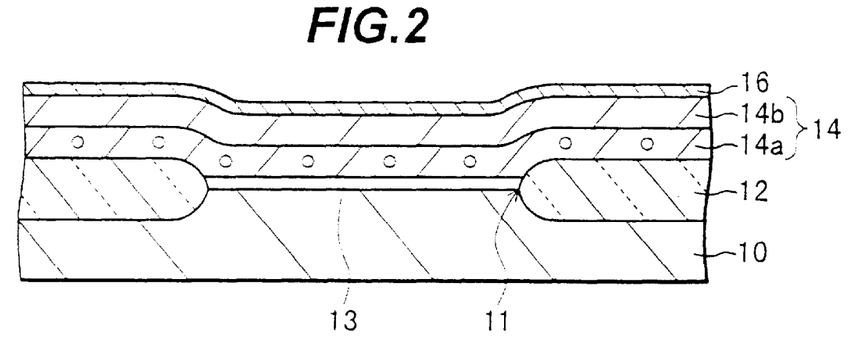
FIG. 2 is a sectional view of the substrate which shows the step of forming the first antireflection coating film subsequently to the step of FIG. 1.

(2) A first antireflection coating film 16 which is made of TiON (or TiN) is formed on the wiring material layer 14 by a sputtering method or the like. The thickness of the antireflection layer 16 is about 40 nm, for example.

Figure 3:
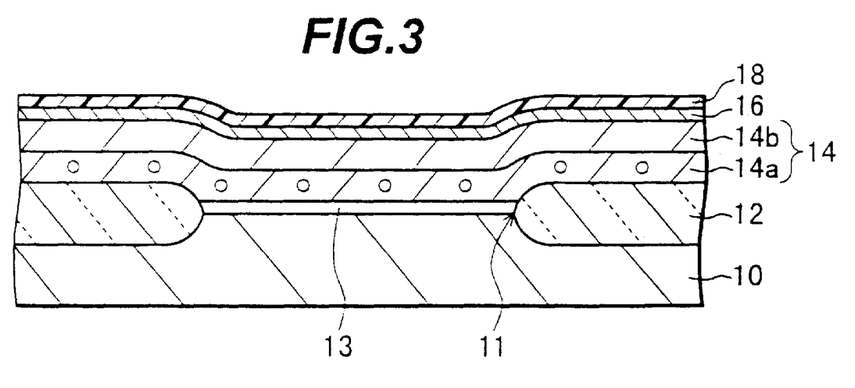
FIG. 3 is a sectional view of the substrate which shows the step of forming the second antireflection coating film subsequently to the step of FIG. 2.

(3) A second antireflection coating film (an organic antireflection coating film) 18, which is made of an organic material, is formed on the antireflection coating film 16 by the spin coating method. The thickness of the antireflection coating film 18 is about 45 nm, for example. The antireflection coating film may be the acrylic polymer having side chains which absorb lights of 248 nm, as described above.

Figure 4:
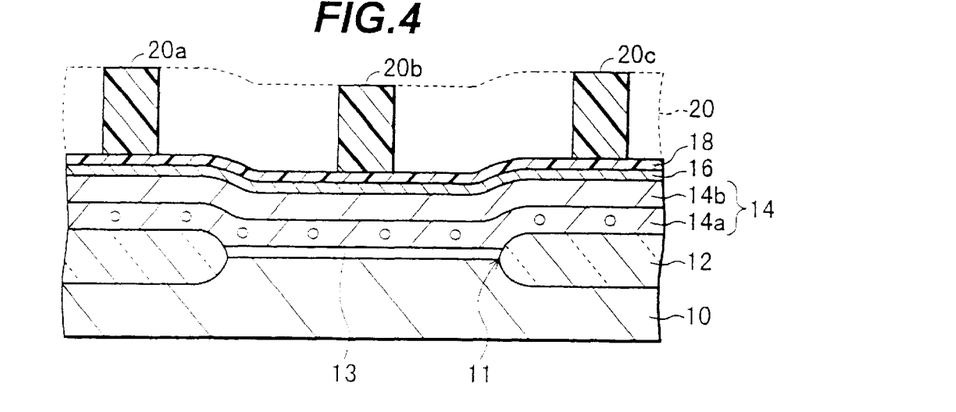
FIG. 4 is a sectional view of the substrate which shows the step of forming the resist layer subsequently to the step of FIG. 3.

(4) A resist layer is coated on the antireflection coating film 18, and resist patterns 20a to 20c are formed by photolithography in accordance with the required wiring patterns. Specifically, the resist layer is formed on the antireflection layer 18 by the spin coating method or the like, to a thickness of 0.5 $\mu$m or more, after which the wiring patterns are transferred from a photomask to the resist layer through utilization of a far ultraviolet exposure apparatus which uses a KrF exciter laser beam as a light source. At that time, since the lamination film which includes the antireflection coating films 16 and 18 suppresses the reflection of light from the interface between the film 16 and the wiring material layer 14, the accuracy of the pattern transfer to the resist layer is improved. After the light exposure, the resist layer is subjected to developing, thus attaining the resist patterns.

FIG. 12 shows the dependence R of the reflectance on the film thickness. This dependence was obtained by performing a computer simulation as regards a lamination film R provided on a $WSi_2$ layer. The lamination film R in this case includes the TiON film corresponding to the antireflection coating film 16 and the organic antireflection coating film corresponding to the antireflection coating film 18 and stacked on the TION film. Computer simulation was done under the conditions as described above. Since the TiON film has the same effect when it has a thickness of 40 nm or more, the thickness of the TiON film was fixed at 40 nm. The thickness of the organic film was varied in the range of 0–150 nm. The abscissa of FIG. 12 represents the thickness of the organic film 18. The computer simulation was conducted under the following conditions:

Wavelength of light: 248 nm

Refractive index "n" and extinction coefficient "k" of TION film corresponding to the film 16:

n=2.28 k=1.5

Refractive index "n" and extinction coefficient "k" of the organic film corresponding to the film 18:

n=1.654 k=0.23

Refractive index "n" and extinction coefficient "k" of the WSi$_2$ layer 14b:

n=2.5 k=3.15

Reflectance at TiON/WSi$_2$ interface: 54.9%

It can be understood from FIG. 12 that in any one of the film thickness ranges A and B, the reflectance variations versus the film thickness variations, associated with the lamination film R, were smaller than those of the organic antireflection film Q, and in the film thickness range A, the reflectance attained by the lamination film R was lower than that attained by the organic antireflection film Q.

In the above-described embodiment, since the lamination film including the films 16 and 18 is formed within a film thickness range such as the range B, the reflectance variations are small and the accuracy of the pattern transfer is high even if the thickness of the lamination film varies due to the unevenness of the surface of the wiring material layer 14. In the case where a thinner lamination film is desired, the lamination film including the films 16 and 18 may be formed within a film thickness range such as the range A.

After a process for exposing the resist film to light is finished, the resist film is subjected to a developing process, thus attaining the resist patterns 20a to 20c corresponding to the required wiring patterns.

Figure 5:
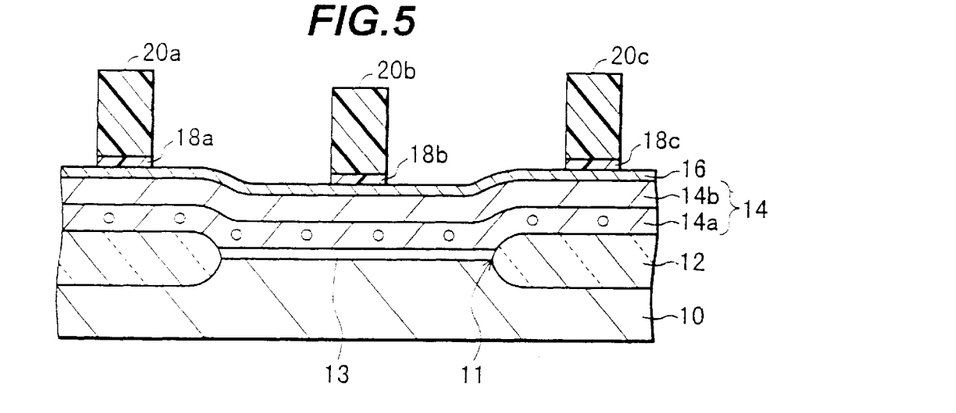
FIG. 5 is a sectional view of the substrate which shows the step of applying dry etching to the second antireflection coating film subsequently to the step of FIG. 4.

(5) By the anisotropic dry etching process which uses the resist patterns 20a to 20c as masks, the antireflection coating film 18 is selectively removed so that parts 18a to 18c of the antireflection coating film 18 are left in correspondence with the resist patterns 20a to 20c. The dry etching of the antireflection coating film 18 can be conducted using an oxygen and/or nitrogen plasma or using a chlorine plasma.

Figure 11:
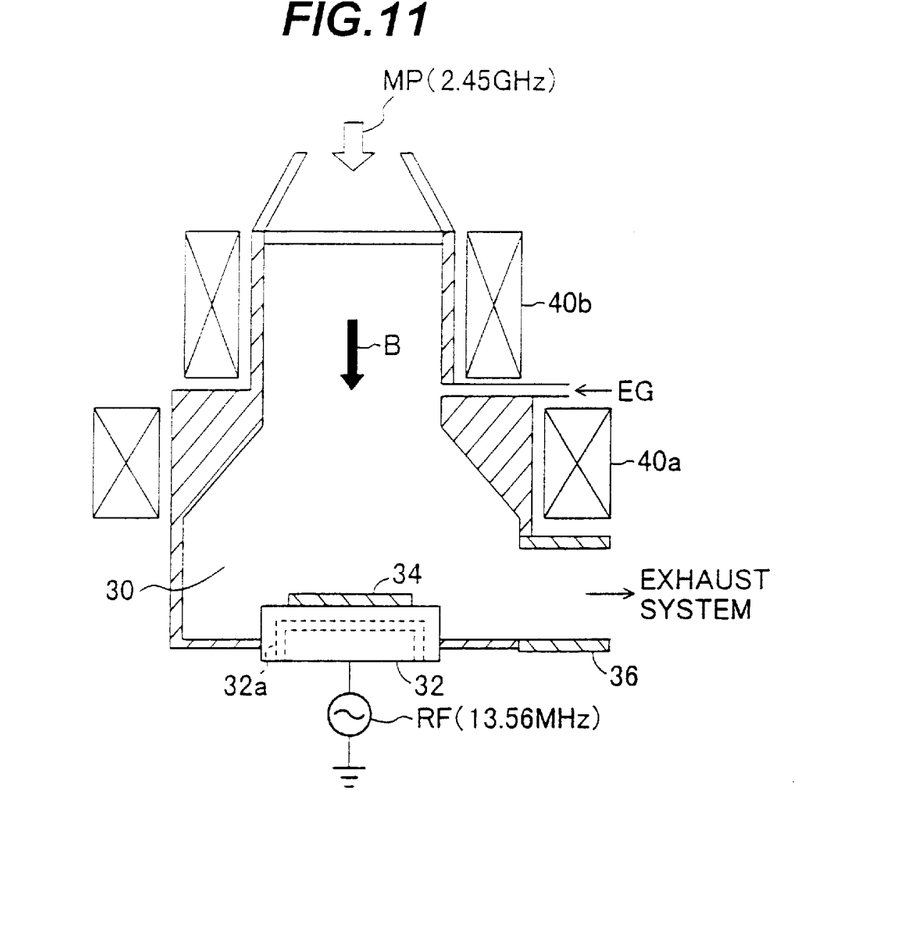
FIG. 11 is a sectional view showing an ECR type plasma etcher used for the dry etching.

As an example, the dry etching of the antireflection film 18 is performed using a plasma etcher of Electron Cyclotron Resonance (ECR) type which is illustrated in FIG. 11.

In the etcher depicted in FIG. 11, a wafer stage 32 for supporting a to-be-processed wafer 34 such as the semiconductor substrate 10 is provided at the bottom of an etching chamber 30. A non-illustrated coolant circulation system circulates a coolant along a coolant path 32a provided in the wafer stage 32, thereby maintaining the temperature of the wafer stage 32 at a predetermined value. A high frequency power source RF of 13.56 MHz is connected between the wafer stage 32 and the ground.

An exhaust tube 36 arranged in the lower part of the etching chamber 30 is coupled to a non-illustrated exhaust or evacuation system. The etching chamber 30 is kept in an evacuated state by being subjected to the evacuation performed through the exhaust tube 36.

An etching gas EG is supplied to the etching chamber 30 through a gas introduction tube 38. The plasma of the etching gas is generated by applying a magnetic B acting in the axial direction of the etching chamber 30 through utilization of electromagnetic coils 40a and 40b, and by supplying 2.45 GHz microwaves from a non-illustrated magnetron to the etching chamber 30. Due to the plasma, etching proceeds on a surface of the to-be-processed wafer 34.

In the case of etching the antireflection coating film 18 by using the etcher illustrated in FIG. 11, the following etching conditions can be adopted as an example:

Pressure in chamber: 1 mTorr

Gas flow amount: Cl$_2$=20 sccm

Microwave power: 600 W

High frequency power: 60 W

Coolant temperature at wafer stage: −20 to +20° C.

The following etching conditions can also be adopted as another example:

Pressure in chamber: 1 mTorr

Gas flow amount: O$_2$/Cl$_2$=20/5 sccm

Microwave power: 600 W

High frequency power: 60 W

Coolant temperature at wafer stage: +5 to +20° C.

Figure 6:
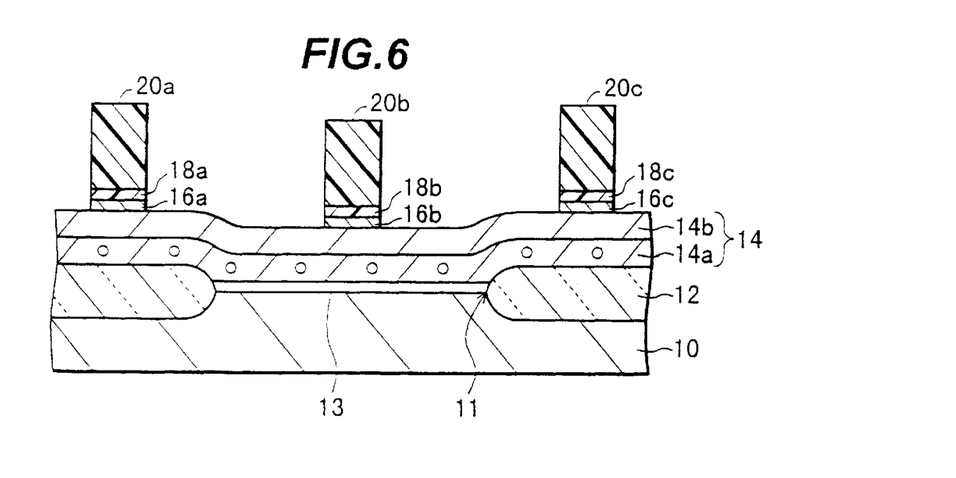
FIG. 6 is a sectional view of the substrate which shows the step of applying dry etching to the first antireflection coating film subsequently to the step of FIG. 5.

(6) By the anisotropic dry etching process which uses the resist patterns 20a to 20c and the residual parts 18a to 18c of the antireflection coating film 18 as masks, the antireflection coating film 16 is selectively removed so that parts 16a to 16c of the antireflection coating film 16 are left in correspondence with the resist patterns 20a to 20c. The dry etching of the antireflection coating film 16 can be performed using the plasma of a chlorine containing gas (a gas containing Cl$_2$, HCl or the like).

In the case of etching the antireflection coating film 16 made of TiON (or TiN) by using the etcher illustrated in FIG. 11, the following etching conditions can be employed as an example:

Pressure in chamber: 1 mTorr

Gas flow amount: Cl$_2$=25 sccm

Microwave power: 600 W

High frequency power: 60 W

Coolant temperature at wafer stage: −20 to +20° C.

The following etching conditions can also be employed as another example:

Pressure in chamber: 1 mTorr

Gas flow amount: Cl$_2$/O$_2$=20/5 sccm

Microwave power: 600 W

High frequency power: 60 W

Coolant temperature at wafer stage: +5 to +20° C.

Figure 7:
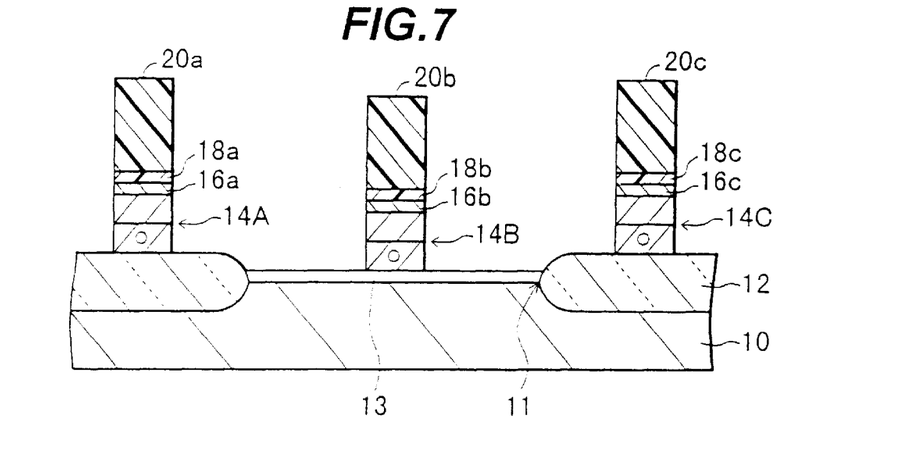
FIG. 7 is a sectional view of the substrate which shows the step of applying dry etching to the wiring material layer subsequently to the step of FIG. 6.

(7) By the anisotropic dry etching process which uses the resist patterns 20a to 20c, the residual parts 18a to 18c of the antireflection coating film 18 and the residual parts 16a to 16c of the antireflection coating film 16 as masks, the wiring material layer 14 is selectively removed so that parts 14A to 14C of the wiring material layer 14 are left in correspondence with the resist patterns 20a to 20c. The dry etching of the wiring material layer 14 can be conducted using the plasma of a gas in which a chlorine or bromine containing gas (a gas containing Cl$_2$, HCl, Br$_2$, HBr or the like) and oxygen are mixed.

In the case of performing the dry etching of the wiring material layer 14 made of polycide of WSi$_2$ and polysilicon by using the etcher illustrated in FIG. 11, the following etching conditions can be adopted as an example:

Pressure in chamber: 1 mTorr

Gas flow amount: $Cl_2/O_2=25/9$ sccm

Microwave power: 1400 W

High frequency power: 40 W

Coolant temperature at wafer stage: −20 to +20° C.

Figure 8:
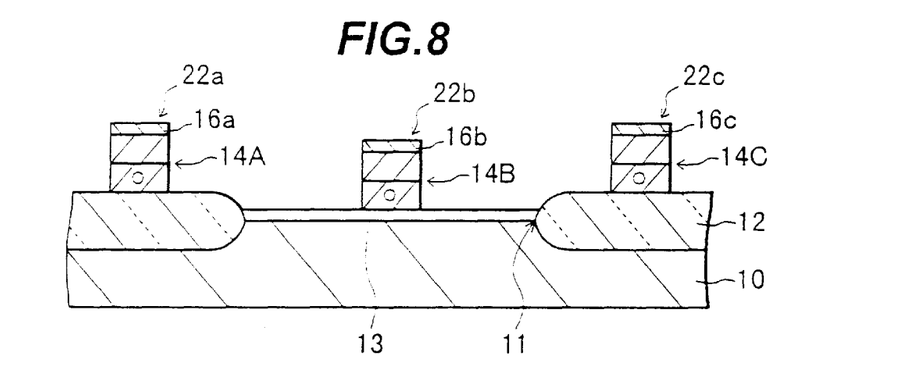
FIG. 8 is a sectional view of the substrate which shows the step of removing the resist layer and the second antireflection coating Film subsequently to the step of FIG. 7.

(8) The resist patterns 20a to 20c and the residual parts 18a to 18c of the antireflection coating film 18 are removed by an ashing treatment which uses an oxygen plasma and/or a chemical treatment which uses an amine containing solvent. Ashing may be done using a microwave down-stream (down-flow) asher under the following conditions.

Flow rate:

$O_2/N_2O=6/0.5$ (slm)

($N_2O$ may not be used), pressure: 4 Torr, $\mu$-wave power: 400 W, substrate stage temperature: 200–240° C., and treatment time: 60 sec.

Chemical treatment using amine-containing liquid may use a mixed liquid of:

(1) dimethyl-sulfoxide ($C_2H_6OS$, which is also called DMSO and methyl-sulfoxide) of 30%, and (2) monoethanolamine ($C_2H_7NO$) of 70%, and rinses the substrate for ten minutes in the mixed liquid heated to 85–90° C. As a result, the lamination layer including the residual part 14a of the wiring material layer 14 and the residual part 16a of the antireflection coating film 16, the lamination layer including the residual part 14b of the wiring material layer 14 and the residual part 16b of the antireflection coating film 16, and the lamination layer including the residual part 14c of the wiring material layer 14 and the residual part 16c of the antireflection coating film 16 are left as wiring patterns 22a to 22c, respectively.

A chemical treatment using $H_2SO_4/H_2O_2$ may be employed as another removing method. With this chemical treatment, the residual parts 16a to 16c of the antireflection coating film 16 can also be removed in addition to the resist patterns 20a to 20c and the residual parts 18a to 18c of the antireflection coating film 18. In this case, the residual parts 14a to 14c of the wiring material layer 14 are left as the wiring patterns.

According to the above-described embodiment, the first antireflection coating film 16 which is made of TiON or TiN is provided under the second antireflection coating film 18 which is made of an organic material. This permits the second antireflection coating film 18 to be formed thin. When the thickness of the antireflection coating film 16 is 40 nm and the thickness of the antireflection coating film 18 is 35 nm as mentioned previously, the thickness of the lamination film R shown in FIG. 12 is 75 nm. For obtaining sufficient antireflection effect, the reflectance is appropriately 3% or less and the thickness of the antireflection coating preferably lies in a range where the variation of reflectance is small. In the case of the laminate R, these conditions are satisfied when the film thickness is 75 nm. In FIG. 12, that thickness of the antireflection coating film Q which makes it possible to attain almost the same antireflectivity as that attained by the 75 nm lamination film R is approximately 110 nm. Thus, compared to the organic antireflection coating film Q which is used singly, the thickness of the organic antireflection coating film 18 is approximately half or less, and the time required to carry out the etching step shown in FIG. 5 is also approximately half or less. Accordingly, the amount of shift in the size of the resist pattern 20a et seq. is reduced, with the result that the precision of the size of the wiring patterns is improved.

Figure 9:
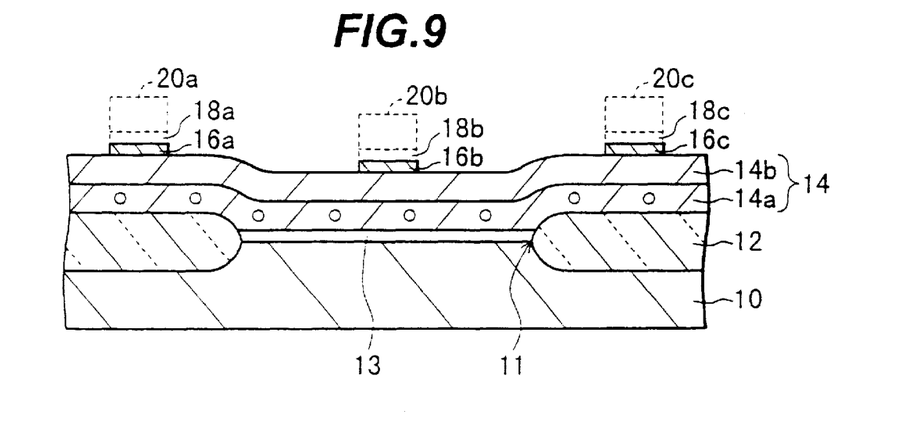
FIG. 9 is a sectional view of the substrate which shows the step of removing, subsequently to the step of FIG. 6, the resist layer and the second antireflection coating film according to the wiring forming method of the second embodiment of the present invention.
Figure 10:
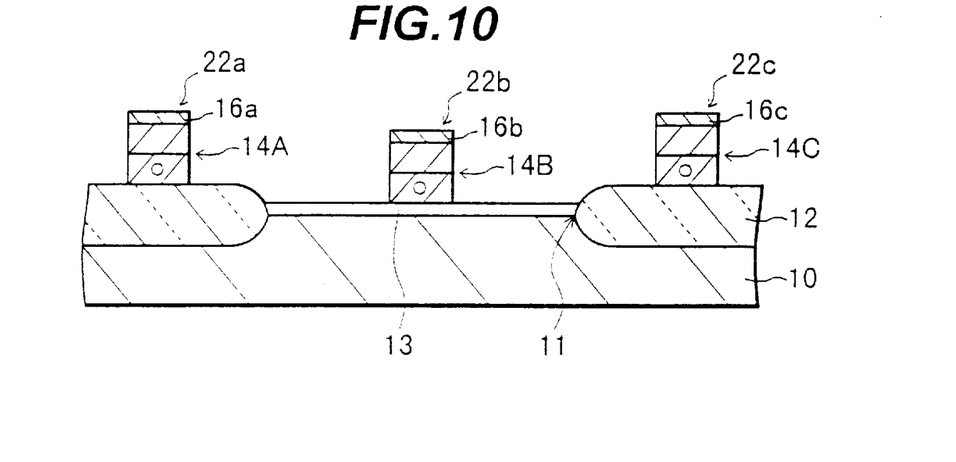
FIG. 10 is a sectional view of the substrate which shows the step of applying dry etching to the wiring material layer subsequently to the step of FIG. 9.

FIGS. 9 and 10 shows a wiring forming method according to the second embodiment of the present invention. In the second embodiment, the steps carried out before the step shown in FIG. 9 are the same as those shown in FIGS. 1 to 6. However, the resist patterns 20a to 20c are formed thin in such a degree that they serve only as the masks used in the dry etching of the antireflection coating films 18 and 16. The thickness of the resist layer needs to be 0.3 $\mu$m or more.

In the step of FIG. 9, subsequently to the step of FIG. 6, the resist patterns 20a to 20c and the residual parts 18a to 18c of the antireflection coating film 18 are removed by the ashing treatment which uses an oxygen plasma and/or the chemical treatment which uses an amine containing solvent. The residual parts 16a to 16c of the antireflection coating film 16 are left as they are.

In the step of FIG. 10, by the anisotropic dry etching process which uses the residual parts 16a to 16c of the antireflection coating film 16 as masks, the wiring material layer 14 is selectively removed so that the parts 14A to 14C of the wiring material layer 14 are left in correspondence with the patterns of the residual parts 16a to 16c. The dry etching of the wiring material layer 14 can be conducted in the same manner as that described previously in regard to the step shown in FIG. 7. As a result, the lamination layer including the residual parts 14a and 16a, the lamination layer including the residual parts 14b and 16b, and the lamination layer including the residual parts 14c and 16c are left as the wiring layers 22a to 22c, respectively.

In the above-described second embodiment, the first antireflection coating film 16 which is made of TiON or TiN is provided under the second antireflection coating film 18 which is made of an organic material. This ensures an improvement in the precision of the size of the wiring patterns, as in the case of the first embodiment.

Further, since the wiring material layer 14 is patterned using the residual parts 16a to 16c of the antireflection coating film 16 as masks after the removal of the resist patterns 20a to 20c and the residual parts 18a to 18c of the antireflection coating film 18, the resist layer can be formed thin by a resist coating step. Due to this, the definition and the depth of focus when transferring the wiring patterns to the resist layer can be improved, and accordingly the accuracy with which fine wiring patterns are transferred to the resist layer can be improved to increase the yield of the formation of a fine wiring.

The present invention is not limited to the above-described embodiments, and various modifications can be made. For example, the wiring is not limited to a gate wiring, and may be any kind of wiring such as a source/drain wiring, an upper layer wiring, etc. The material of the wiring material layer 14 is not limited to polycide of $WSi_2$ and polysilicon, and other types of polycide, a metal having a high melting point such as W, silicide like MoSi2, polysilicon, Al, an Al alloy, Cu, an Cu alloy, etc. can also be adopted. As regards this general knowledge of semiconductor devices, a reference may be made to U.S. Pat. No. 5,707,883, which is incorporated herein by reference.

What is claimed is:

1. A wiring forming method comprising the steps of:

forming a wiring material layer from a polycide on an insulation film covering one of major surfaces of a substrate;

forming a first antireflection coating film made of Ti(O)N on said wiring material layer;

stacking a second antireflection coating film made of an organic material directly on said first antireflection coating film;

coating a resist layer on a lamination film which includes said first and second antireflection coating films, and exposing said resist layer to light in accordance with predetermined wiring patterns;

forming resist patterns by developing said resist layer which has been exposed to light;

selectively removing said second antireflection coating film by anisotropic dry etching which uses said resist patterns as masks, in order to leave patterns of said second antireflection coating film which correspond to said resist patterns;

selectively removing said first antireflection coating film by anisotropic dry etching which uses said resist patterns and the patterns of said second antireflection coating films as masks, in order to leave patterns of said first antireflection coating film which correspond to said resist patterns;

selectively removing said wiring material layer by anisotropic dry etching with an etchant containing $O_2$, which uses said resist patterns, the patterns of said second antireflection coating film and the patterns of said first antireflection coating film as masks, in order to leave patterns of said wiring material layer which correspond to said resist patterns; and removing at least said resist patterns and the patterns of said second antireflection coating film, and leaving the patterns of said wiring layer as wiring layers.

2. The wiring forming method according to claim 1, wherein said second antireflection coating film comprises acrylic acid resin having a side chain which absorbs light of a wavelength 248 nm.

3. The wiring forming method according to claim 2, wherein said side chain includes 4. The wiring forming method according to claim 3, wherein said acrylic acid resin is where R is a part which absorbs light of a wavelength 248 nm, x is 10 to 80 mol %, and y is 20 to 90 mol %.

* * * * *